(12) United States Patent
Sunkavalli et al.

(10) Patent No.: US 6,188,609 B1
(45) Date of Patent: Feb. 13, 2001

(54) RAMPED OR STEPPED GATE CHANNEL ERASE FOR FLASH MEMORY APPLICATION

(75) Inventors: Ravi S. Sunkavalli, Santa Clara; Sameer S. Haddad, San Jose, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/307,259

(22) Filed: May 6, 1999

(51) Int. Cl.[7] .................................................. G11C 16/06
(52) U.S. Cl. ............................ 365/185.22; 365/185.19; 365/185.26; 365/185.3
(58) Field of Search ....................... 365/185.22, 185.26, 365/185.29, 185.3, 185.19, 185.01

(56) References Cited

U.S. PATENT DOCUMENTS

| | | | |
|---|---|---|---|
| 5,642,311 | * 6/1997 | Cleveland et al. | 365/185.3 |
| 5,841,165 | * 11/1998 | Chang et al. | 257/318 |
| 5,963,476 | * 10/1999 | Hung et al. | 365/185.22 |
| 5,970,460 | * 8/1998 | Chen et al. | 365/185.29 |
| 5,978,277 | * 11/1999 | Hsu et al. | 365/185.29 |
| 5,991,205 | 11/1999 | Hara | 365/185.29 |

FOREIGN PATENT DOCUMENTS

WO 98/10471    3/1998  (WO).
WO 98/47151   10/1998  (WO).

* cited by examiner

*Primary Examiner*—David Nelms
*Assistant Examiner*—Hoai V. Ho
(74) *Attorney, Agent, or Firm*—H. Donald Nelson

(57) ABSTRACT

A method for erasing a flash EEPROM cell by applying a voltage differential between the control gate and the well of the memory cell. The voltage differential can be a ramped or stepped voltage applied to the control gate, a ramped or stepped voltage applied to the well, or a ramped or stepped voltage applied to the control gate and a ramped or stepped voltage applied to the well. The ramped voltages can have a constant slope or the slope can vary. The stepped voltages can be incremented equally or unequally. The voltages applied to the well or to the control gate is ramped or stepped until a selected number of memory cells verify as erased at which time the voltages applied to the well or to the control gate is clamped until the erase procedure is finished.

19 Claims, 14 Drawing Sheets

RAMPED OR STEPPED GATE CHANNEL ERASE FOR FLASH MEMORY APPLICATION

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory (EEPROM) devices. Even more specifically, this invention relates to a method of erasing a microelectronic flash Electrically Erasable Programmable Read-Only Memory devices that decreases the degradation of the erase speed.

2. Discussion of the Related Art

A microelectronic flash or block erase Electrically Erasable Programmable Read-Only Memory (Flash EEPROM) includes an array of cells that can be independently programmed and read. The size of each cell and thereby the memory are made small by omitting transistors known as select transistors that enable the cells to be erased independently. As a result, all of the cells are erased together as a block.

A memory of this type includes individual Metal-Oxide-Semiconductor (MOS) field effect transistor memory cells, each of which includes a source, a drain, a floating gate and a control gate to which various voltages are applied to program the cell with a binary 1 or 0, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying a voltage, typically 9 volts to the control gate, applying a voltage of approximately 5 volts to the drain and grounding the source, which causes hot electrons to be injected from a drain depletion region into the floating gate. Upon removal of the programming voltages, the injected electrons are trapped in the floating gate and create a negative change therein which increases the threshold voltage of the cell to a value in excess of approximately 4 volts.

A cell is read by applying typically 5 volts to the control gate, applying 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, a cell is erased by applying a relatively high voltage, typically 12 volts, to the source, grounding the control gate and allowing the drain to float. This causes the electrons that were injected into the floating gate during programming to undergo Fowler-Nordheim tunneling from the floating gate through the thin tunnel oxide layer to the source. A cell can also be erased by applying a negative voltage on the order of −10 volts to the control gate, applying 5 volts to the source and allowing the drain to float. Another method of erasing is by applying 5V to the P-well and −10V to the control gate while allowing the source/drain to float.

A problem with the conventional flash EEPROM cell arrangement is that due to manufacturing tolerances, some cells become over-erased before other cells become erased sufficiently. The floating gates of the over-erased cells are depleted of electrons and become positively charged. This causes the over-erased cells to function as depletion mode transistors that cannot be turned off by normal operating voltages applied to their control gates. The cells functioning as depletion mode transistors introduce leakage current during subsequent program and read operations.

More specifically, during program and read operations only one wordline that is connected to the control gates of a row of cells is held high at a time, while the other wordlines are grounded. However, a positive voltage is applied to the drains of all of the cells and if the threshold voltage of an unselected cell is zero or negative, the leakage current will flow through the source, channel and drain of the cell.

The undesirable effect of the leakage current from the over-erased cells is as follows. In a typical flash EEPROM, the drains of a large number of memory transistor cells, for example 512 transistor cells are connected to each bitline. If a substantial number of cells on the bitline are drawing background leakage current, the total leakage current on the bitline can exceed the cell read current. This makes it impossible to read the state of any cell on the bitline and therefore renders the memory inoperative.

Because the background leakage current of a cell varies as a function of threshold voltage, the lower (more negative) the threshold voltage the higher the leakage current. It is therefore desirable to prevent cells from being over-erased and reduce the threshold voltage distribution to as low a range as possible, with ideally all cells having the same high threshold voltage after erase on the order of 2 volts.

It is known in the art to reduce the threshold voltage distribution by performing an over-erase correction operation, which reprograms the most over-erased cells to a higher threshold voltage. An over-erase correction operation of this type is generally known as Automatic Programming Disturb (APD).

A preferred APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland. This patent is assigned to the same assignee as the present invention and is incorporated herein by reference in its entirety. The method includes sensing for over-erased cells and applying programming pulses thereto, which bring their threshold voltages back up to acceptable values.

Following application of an erase pulse, under-erase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current and thereby determine if the threshold voltage of the cell is above a value of, for example, 2 volts. If the cell is under-erased, indicated by a threshold voltage above 2 volts, the bitline current will be low. In this case, an erase pulse is applied to all of the cells, and the first cell is erase verified again.

After application of each erase pulse and prior to a subsequent erase verify operation, over-erase correction is performed on all of the cells of the memory. Over-erase verify is performed on the bitlines of the array in sequence. This is accomplished by grounding the wordlines, applying typically 1 volt to the first bitline, and sensing the bitline current. If the current is above a predetermined value, this indicates that at least one of the cells connected to the bitline is over-erased and is drawing leakage current. In this case, an over-erase correction pulse is applied to the bitline. This is accomplished by applying approximately 5 volts to the bitline for a predetermined length of time such as 100 μs.

After application of the over-erase correction pulse the bitline is verified again. If bitline current is still high indicating that an over-erased cell still remains connected to the bitline, another over-erase correction pulse is applied. This procedure is repeated for all of the bitlines in sequence.

The procedure is repeated as many times as necessary until the bitline current is reduced to the predetermined value, which is lower than the read current. Then, the procedure is performed for the rest of the cells in the first row and following rows until all of the cells in the memory have been erase verified.

By performing the over-erase correction procedure after each erase pulse, the extent to which cells are over-erased is reduced, improving the endurance of cells. Further, because over-erased cells are corrected after each erase pulse, bitline leakage current is reduced during erase verify, thus preventing under-erased cells from existing upon completion of the erase verify procedure.

The erase procedure causes electron trapping to occur in the tunnel oxide. In addition, the undererase and overerase procedures causes electron trapping to occur in the tunnel oxide. Although each programming/erase cycle adds only a small number of electron trapping, the cumulative electron trapping increases as each programming/erase cycle is completed which, in turn, increasingly degrades the erase time.

Therefore, what is needed is a method of performing the erase procedure that minimizes the degradation of the erase time as the number of program/erase cycles increases.

SUMMARY OF THE INVENTION

According to the present invention, the foregoing and other objects and advantages are obtained by a method of erasing a flash Electrically-Erasable Programmable Read Only Memory (EEPROM) cell by applying a ramped or stepped voltage to the control gates of the memory cells to be erased.

In accordance with one aspect of the invention, a voltage differential is applied between the control gate and the well of the cells to be erased and the voltage differential is incremented until a selected number of memory cells verify as erased at which time the voltage differential is clamped.

In accordance with another aspect of the invention, the voltage differential applied between the control gate and the well of the cells to be erased is a positive voltage applied to the well and an increasing ramped or stepped negative voltage applied to the control gate.

In accordance with another aspect of the invention, the voltage differential applied between the control gate and the well of the cells to be erased is a negative voltage applied to the control gate and an increasing ramped or stepped positive voltage applied to the well.

In accordance with still another aspect of the invention, the voltage differential applied between the control gate and the well of the cells to be erased is a ramped or stepped positive voltage applied to the well and a ramped or stepped negative voltage applied to the control gate.

In accordance with another aspect of the invention, the memory cells are arranged in a plurality of sectors and the method comprises performing the above procedure to each sector sequentially.

In accordance with an aspect of the invention, the drain and source are floated during the erase procedure.

In accordance with still another aspect of the invention, the drain and source are connected to the well during the erase procedure.

In accordance with still another aspect of the invention, a complete erase and Automatic Program Disturb (APD) procedure is applied to the memory cells after each application of an erase pulse to the control gates of the memory cells.

The described method thus provides a method of erasing flash EEPROM cells that reduces the degradation of the erase time of the cells after many program/erase cycles.

The present invention is better understood upon consideration of the detailed description below, in conjunction with the accompanying drawings. As will become readily apparent to those skilled in the art from the following description, there is shown an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention, which illustrate the best mode presently contemplated by the inventors for practicing the invention. It should be understood that the description of the best mode is merely illustrative and that it should not be taken in a limiting sense.

Figure 1A:
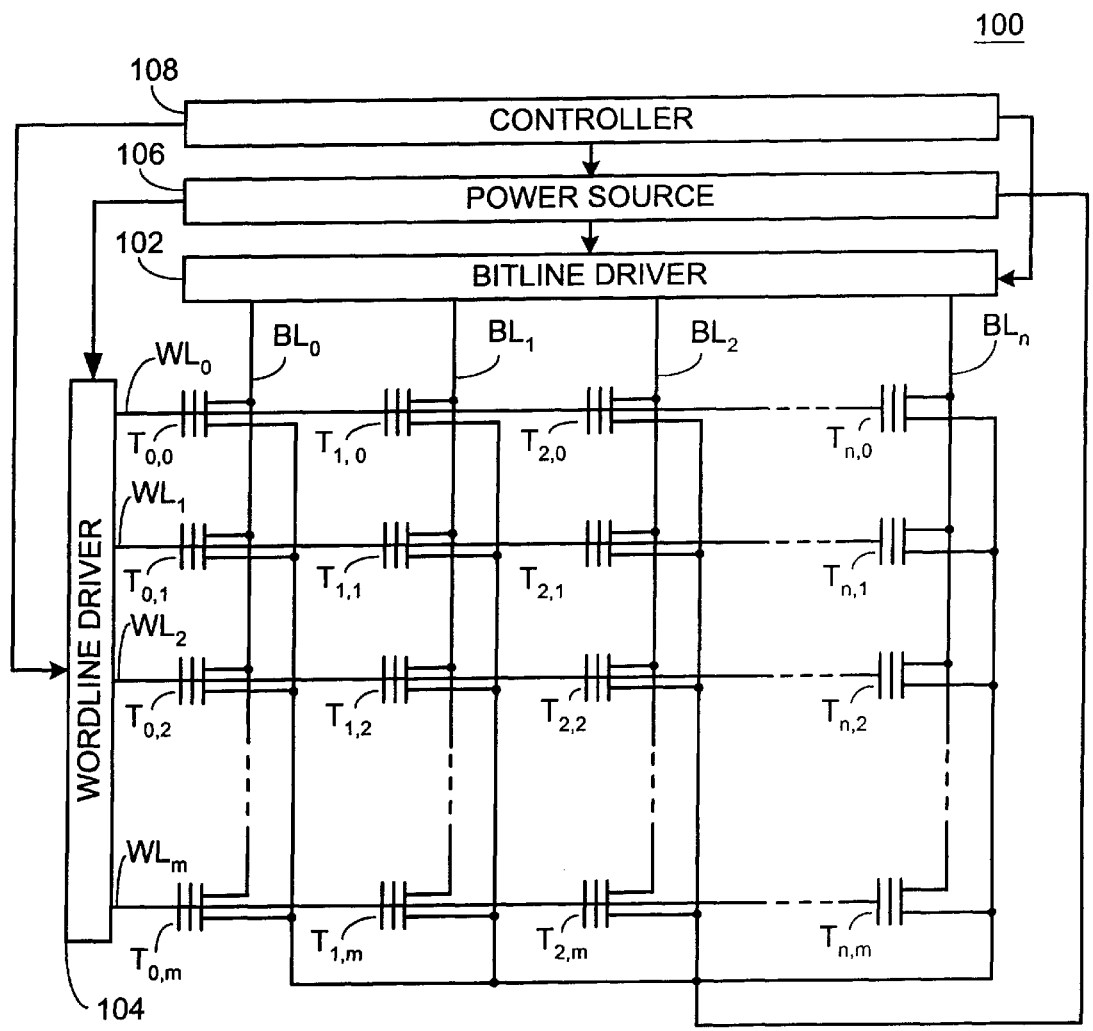
FIG. 1A is a simplified electrical schematic diagram of a flash EEPROM.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 102, whereas appropriate voltages are applied to the wordlines by a wordline driver 104. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
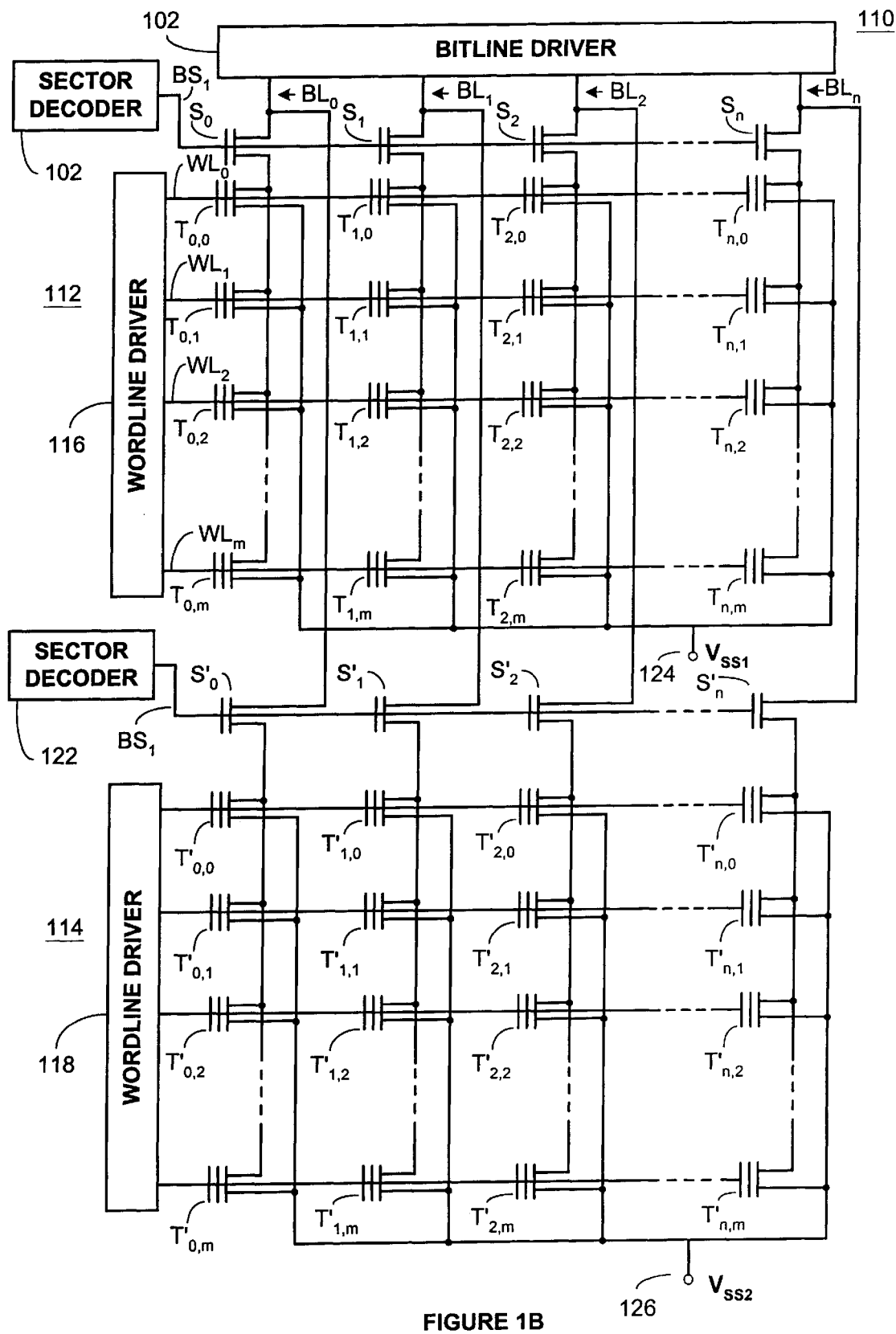
FIG. 1B is similar to FIG. 1A but illustrates a flash EEPROM having cells arranged in two pages or banks.

FIG. 1B illustrates another flash EEPROM memory 110 which is similar to the memory 100 except that the cells are divided into a banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal BS$_2$ and select transistors S'$_0$ to S'$_n$. The operation of the memory 110 is essentially similar to that of the memory 100 (FIG. 1A), except that the program, erase and read operations can be performed on the banks 112 & 114 independently.

Figure 2A:
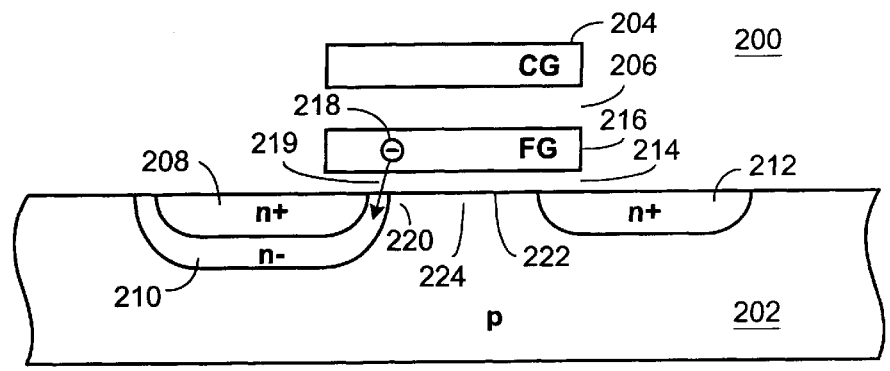
FIG. 2A is a cross-sectional view of a flash EEPROM cell illustrating a negative control gate voltage method of erasing the cell.

FIG. 2A is a simplified sectional view illustrating the construction of one type of memory cell 200. The memory cell 200 uses hot-electrons for programming and Fowler-Nordheim tunneling using a negative control gate voltage for erasing. The memory cell 200 is fabricated on a p-type substrate 202, which is maintained at ground potential during operation. To erase the memory cell, a negative control gate voltage technique is used whereby a large negative voltage of about −11 volts is applied to the control gate 204, which is constructed on top of insulator 206. At the same time a moderate positive voltage of about 5 volts is applied to the source region, which is comprised of n+ region 208 and an n− region 210. Drain region 212 is floated during erase. The vertical electric field across the floating gate silicon dioxide layer 214 locating between floating gate 216 and the source region 208, 210 causes the electrons 218 to tunnel through the dielectric layer 214, as indicated by arrow 219, into the source region 208,210.

There are two significant problems with the erase technique used for the memory cell 200. The first problem is that the source junction 220 may need the additional, lightly doped, n-diffused region 210 surrounding the heavily-doped n+ source region 208, as shown in FIG. 2A. This additional diffused region limits the scaling down of the memory cell 200 into a smaller device as new processing procedures emerge. The second problem is that some current flows from the combined source region 208, 210 into the substrate 202 when the source junction 220 is reverse biased during erase. This current is referred to as band-to-band (BB) tunneling current. The magnitude of the band-to-band tunneling current depends upon the magnitude of the reverse bias voltage applied to source region 220. With control gate 204 biased at a negative voltage, the hole component (called "hot holes") of the band-to-band tunneling current tends to follow the electric field and bombard semiconductor dielectric interface 222 and the dielectric layer 214. These hot holes can damage the interface 222 by generating undesirable interface states. In addition, some of these hot holes may actually have enough energy to be injected into dielectric layer 214, where they are trapped. These trapped hot holes degrade the performance of the memory device. The negative control gate voltage technique for erasing memory cells generate hole trap-ups and interface states that cause reliability problems such as window-opening, charge loss, erratic erase and accentuating gate disturb. These interface states and trapped holes distribute themselves laterally from the source PN junction 220 into the channel region 224. The peak density and the width of this trapped hole distribution depend upon both the junction bias and the control gate bias during the erase operation. For a long channel device, the width of this hole distribution is small relative to the entire channel length, and its adverse impact on device reliability and performance is small. However, for a deep, sub-micron device, the width of this distribution becomes a significant proportion of the channel length. As such, its adverse impact upon device reliability and performance is much more significant.

Figure 2B:
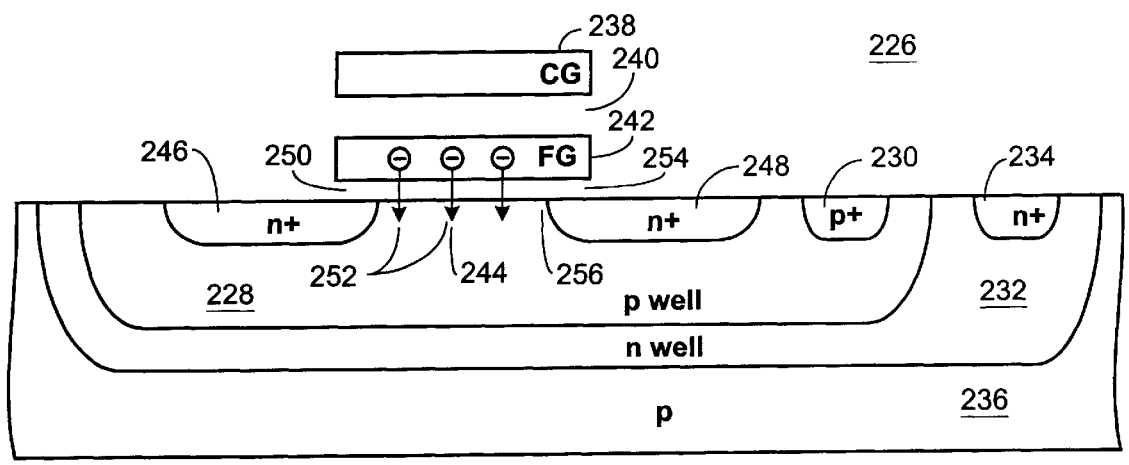
FIG. 2B is a cross-sectional view of a flash EEPROM cell illustrating a negative gate channel erase method of erasing the cell.

FIG. 2B is a simplified sectional view illustrating the construction of a second type of memory cell 226. The memory cell 226 is formed in a p-well 228, which may be contacted using p+ region 230. The p-well 228 is formed in an n-well region 232, which may be contacted using n+ region 234. The n-well region 232 is formed in a p substrate 236. To erase memory cell 226, a large negative voltage of about −11 volts is applied to control gate 238. Control gate 238 lies on top of insulator 240, which, in turn, lies on top of floating gate 242. At the same time as the negative voltage is applied to the control gate, a moderate positive voltage of about 5 volts is applied to the p-type channel region 244 through p+ region 230 and p-well region 228. Because the p-type substrate 236 is grounded, the application of a positive voltage through p+ contact region 230 to p-type channel region 244 requires the formation of the isolated p-well 228 inside n-well 232. During erase, source region 246 and drain region 248 are floated at a potential below the bias voltage of p-well 228. This potential depends upon the geometry of the source and drain regions 246 & 248 and also upon the amount of leakage current from the drain and source regions. This erase technique is referred to as the negative gate channel erase technique. In the negative gate channel erase technique, the electrons in the floating gate 242 tunnel vertically through floating gate dielectric 250 into the channel region 244 as indicated by the vertical, downwardly pointing arrows 252. Since there is no electrical bias between the source region 246 and the p-well region 228, and the source region 246 is floating, no band-to-band current exists. However, in a stacked gate flash memory, other device reliability problems may result. For instance, since erasing is done over the channel region 244, interface state generation and oxide trap-up are all distributed along the channel region 244. Such a concentration of interface states and oxide trap-up degrades the memory cell read current, which may in turn slow down the reading speed and may eventually cause read errors. Trap-up at the portion 254 of the oxide layer 250, which lies beneath floating gate 242 and above the drain junction 256, may also retard hot electron injection during programming.

In addition, the electron trapping in the tunnel oxide 250 causes the erase speed to degrade roughly by a factor of 7–8 times after 50,000 cycles.

The background and associated device reliability issues with respect to these erase techniques are described in the following publications: Haddad, et al., "Degradation Due to Hole Trapping in Flash Memory Cell," IEEE Electronic Devices Letters, Vol. 10., No. 3, March 1989, pp. 177–179; Chun, et al., "Lateral Distribution of Erase Induced Damage in Flash EPROM Device," SRC Techcon, September 1996; Chun, et al., "Lateral Distribution of Erase Induced Hole trapping and Interface Traps in Flash EPROM NMOSFET Devices," IEEE Semicondurt Interface Specialists Conference, 1996; Witters, et al., "Degradation of Tunnel-Oxide Floating Gate EPROM Devices and Correlation With High-Field-Current-Induced Degradation of Thin Gate Oxides," IEEE Transactions On Electron Devices, Vol. 36, No. 9, September 1989, p. 1663; and Kobayashi, et al., "Memory Array Architecture and Decoding Scheme for 3 V Only Sector Erasable DINOR Flash Memory," IEEE Journal of Solid-State Circuits, Vol. 29, No. 4, April 1994, pp. 454–458.

Figure 3:
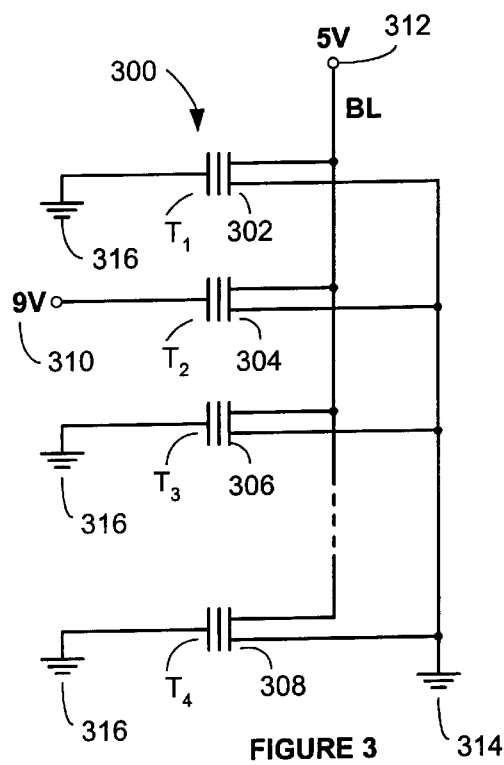
FIG. 3 is a simplified electrical schematic diagram of a column of flash EEPROM cells showing the control gate, source and drain voltages during the programming of one of the cells.

FIG. 3 is a simplified electrical schematic diagram of a column 300 of flash EEPROM cells 302, 304, 306, 308 showing the control gate, source and drain voltages during the programming of one of the flash cells. The cell 304 is programmed by applying a relatively high voltage to the control gate of the selected cell, typically approximately 9 volts as shown at 310, applying a moderate voltage to the drain via the bitline (BL), typically approximately 5 volts as shown at 312, and grounding the source as shown at 314. The gates of the non-selected flash cells are grounded as shown at 316. This combination of programming voltages causes hot electrons to be injected from the drain depletion region into the floating gate of cell 304. Upon removal of the various programming voltages, the injected electrons are trapped in the floating gate and create a negative charge therein, which increases the threshold voltage of cell 304 to a value in excess of approximately 4 volts.

A cell is read by applying typically 5 volts to the control gate and 1 volt to the bitline to which the drain is connected, grounding the source, and sensing the bitline current. If the cell is programmed and the threshold voltage is relatively high, on the order of 4 volts, the bitline current will be zero or at least relatively low. If the cell is not programmed or erased, the threshold voltage will be relatively low, on the order of 2 volts, the control gate voltage will enhance the channel, and the bitline current will be relatively high. Reading and verifying, which is discussed below, are preferably performed using sense amplifiers and a reference current array as disclosed in the above referenced patent to Cleveland. The details of these elements are not the particular subject matter of the present invention.

Figure 4A:
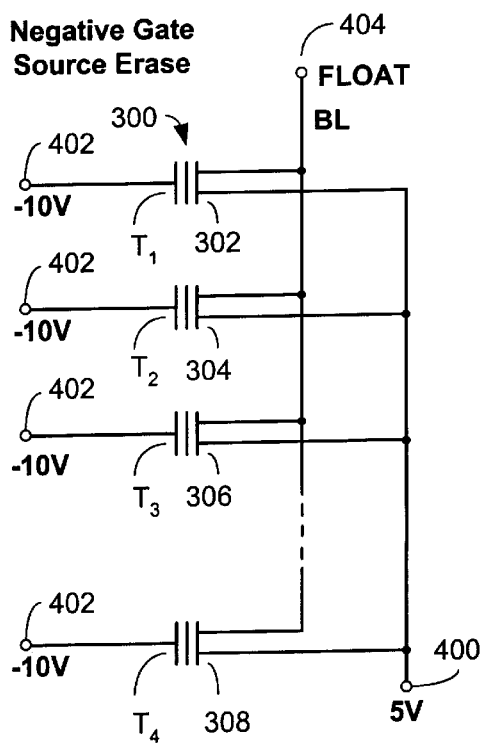
FIG. 4A is a simplified electrical schematic diagram of a column of flash EEPROM cells showing the control gate, source and drain voltages during a first method of erasing the cells in the column.

FIG. 4A is a simplified electrical schematic diagram of the column 300 of flash EEPROM cells 302, 304, 306, and 308 as shown in FIG. 3, and showing the control gate, source and drain voltages during the erasure of all of the flash cells. As is known in the art, all of the cells are erased simultaneously. In the erasure method shown in FIG. 4A, a moderately high voltage, typically 5 volts, is applied to the sources as shown at 400, a negative voltage of approximately −10 volts is applied to control gates as shown at 402, and the drains are floated as shown at 404. This causes the electrons which were injected into the floating gate during programming to be removed by Fowler-Nordheim tunneling from each of the floating gates through the respective tunnel oxide layers to the respective source regions.

Figure 4B:
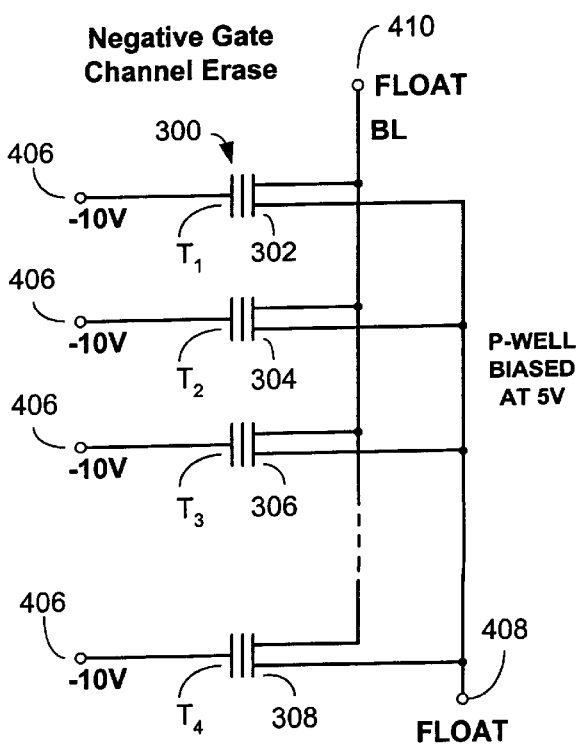
FIG. 4B is a simplified electrical schematic diagram of a column of flash EEPROM cells showing the control gate, source and drain voltages during a second method of erasing the cells in the column.

FIG. 4B shows an alternative method of erasing the column 300 of flash EEPROM cells 302, 304, 306, and 308 as shown in FIG. 4A, wherein the P-well is biased at 5V and a negative voltage on the order of −10 volts is applied to the control gates as shown at 406 and the sources and drains are floated as indicated at 408 and 410, respectively.

In each of the above method of erasing, the memory cells are erased by applying one or more erase pulses to all of the cells (or all of the cells in a bank or sector) of the memory. In the discussion below, the memory cells are assumed to be NMOS enhancement mode FETs. However, it will be understood that the invention is not so limited and that the scope thereof encompasses applying the principles described herein to other types and configurations including, for example, PMOS and/or depletion mode FETs in any combination.

Following application of an erase pulse, under-erase correction is first performed on a column-by-column basis for each row. First, the cell in the first row and column position is addressed and erase verified by applying typically 4 volts to the control gate (wordline), applying 1 volt to the drain (bitline), grounding the source, and using sense amplifiers to sense the bitline current and thereby determining if the cell is undererased.

If the cell is undererased, the bitline current will be zero or at least relatively low. In this case, an erase pulse is applied to all of the cells, and the first cell is erase verified again. This procedure is repeated as many times as necessary until the bitline current has been brought above a predetermined value corresponding to an erased cell. Then, the procedure is performed for the rest of the cells in the first row and following rows until all of the cells in the memory have been erase verified.

An overerase correction procedure is preferably performed after the application of each erase pulse to the memory in accordance with the erase method described above. After application of each erase pulse and prior to a subsequent erase verify operation, overerase correction is performed on all of the cells of the memory. Overerase verify is performed on the bitlines of the array in sequence. This is accomplished by grounding the wordlines, applying typically 1 volt to the first bitline, and sensing the bitline current. If the current is above a predetermined value, this indicates that at least one of the cells connected to the bitline is overerased and is drawing leakage current. In this case, an overerase correction pulse is applied to the bitline. This is accomplished by applying approximately 5 volts to the bitline for a predetermined length of time such as 100 µs.

After application of the overerase correction pulse the bitline is verified again. If bitline current is still high, indicating that an overerased cell still remains connected to the bitline, another overerase correction pulse is applied. This procedure is repeated for all of the bitlines in sequence.

By performing the overerase correction procedure after each erase pulse, the extent to which cells are overerased is reduced, improving the endurance of the cells. Further, because overerased cells are corrected after each pulse, bitline leakage current is reduced during erase verify, thus preventing undererased cells from existing upon completion of the erase verify procedure.

The overerase correction procedure includes applying one or more overerase correction pulses to all of the cells of the memory, or alternatively to all of the cells in a bitline or sector (bank). The pulse or pulses are applied for a time that is predetermined to achieve the desired result.

The erase procedure causes electron trapping to occur in the tunnel oxide. In addition, the undererase and overerase procedure causes electron trapping to occur in the tunnel oxide. As can be appreciated, although each programming/erase cycle adds only a small number of electron trapping, the cumulative electron trapping as each programming/erase cycle is completed increasingly degrades the erase time.

Figure 5:
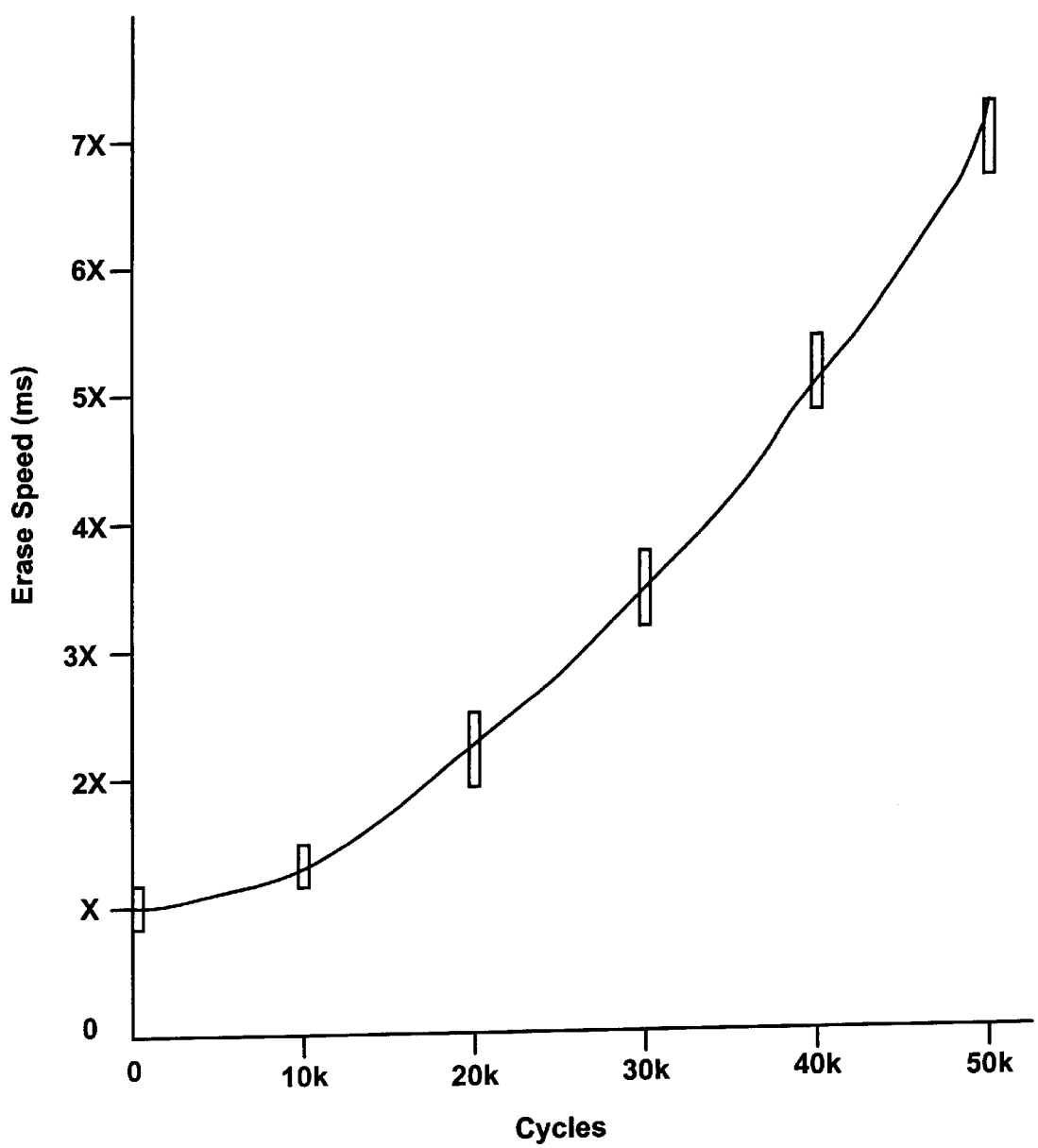
FIG. 5 is a graph of erase speed versus number of programming/erase cycles for a flash memory device using a constant control gate voltage during erase.

FIG. 5 is a graph of erase speed versus number of programming/erase cycles for convention flash memory devices using a constant control gate voltage during erase. As is shown in FIG. 5, the erase time progressively becomes longer and after 50,000 programming/erase cycles the erase time is about 7 times the initial erase time.

Figure 6A:
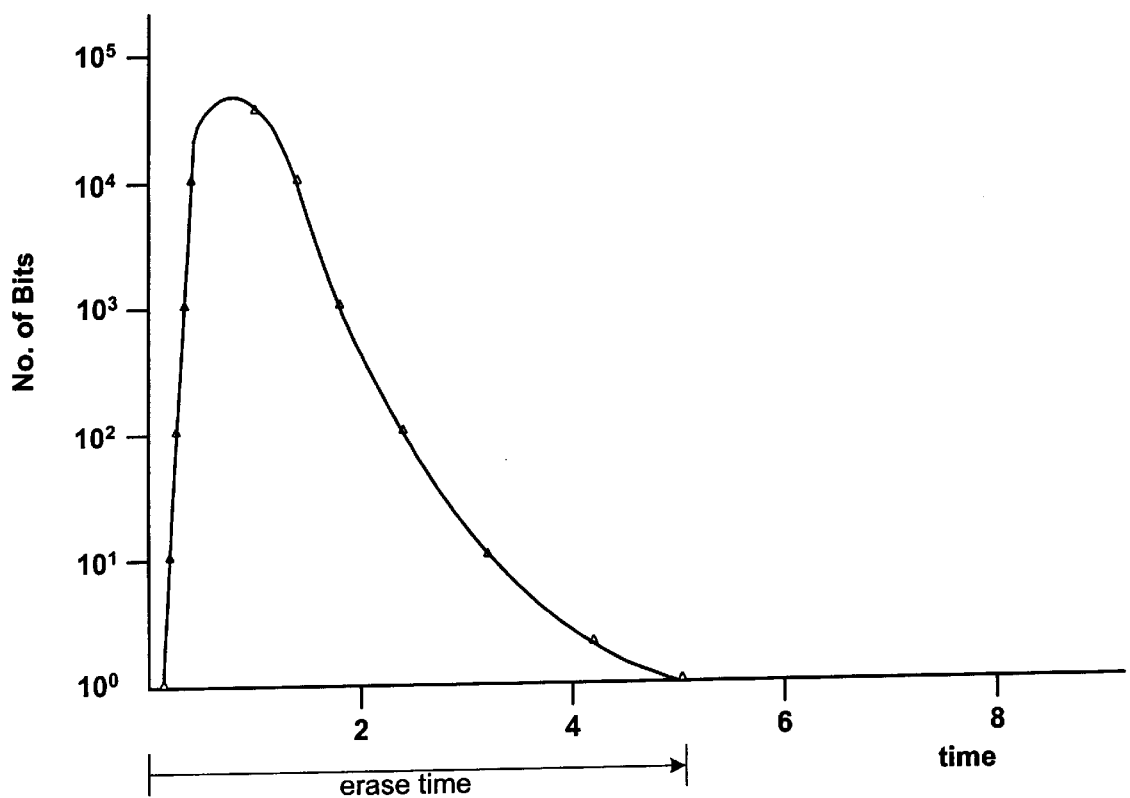
FIG. 6A is a graph of the number of bits erased versus time for flash memory devices using a constant control gate voltage during erase.
Figure 6B:
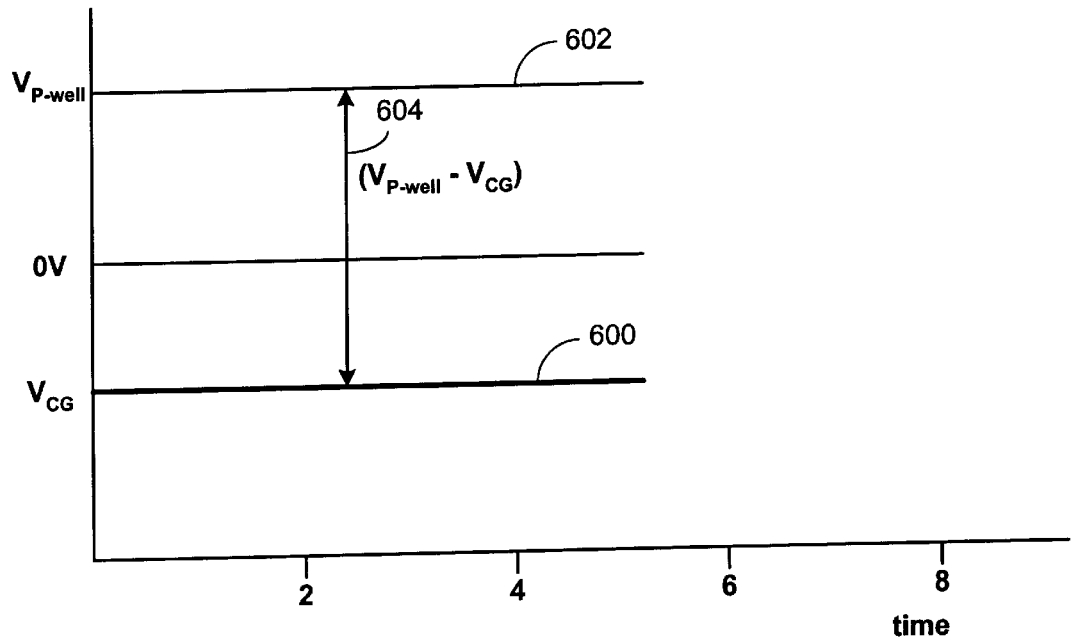
FIG. 6B is a graph of the control gate voltage versus time corresponding to FIG. 6A.

FIG. 6A is a graph of the number of incremental bits erased versus time for flash memory devices using a constant control gate voltage, $V_{CG}$, during erase. FIG. 6B is a graph of the constant control gate voltage $V_{CG}$ 600 versus time during the erase procedure. The P-well voltage is also held constant and is shown at 602. The voltage difference $V_{P\text{-}well} - V_{CG}$ is indicated at 604 and as can be appreciated, the voltage difference $V_{P\text{-}well} - V_{CG}$ is constant during the erase procedure.

Figure 7A:
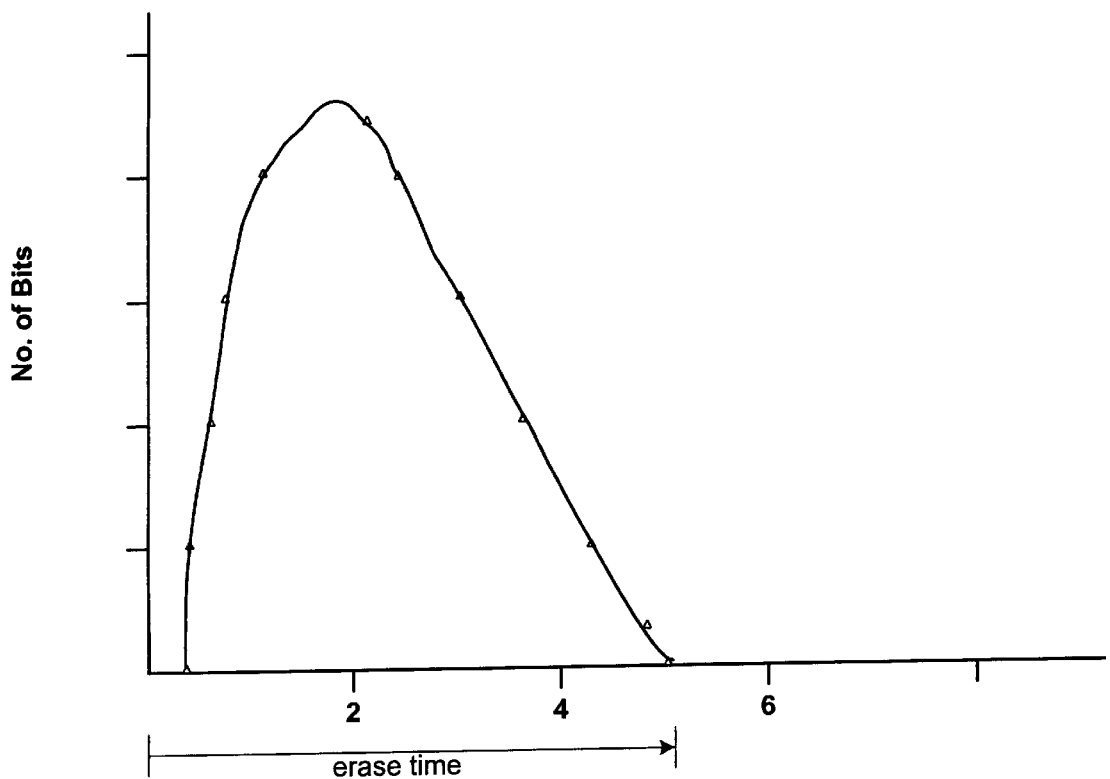
FIG. 7A is a graph of the number of bits erased versus time for flash memory devices using a stepped control gate voltage during erase, a stepped P-well voltage during erase, or a stepped control gate voltage and a stepped P-well voltage during erase.

FIG. 7A is a graph of the number of incremental bits erased versus time for flash memory devices similar to the devices used to generate the graph of FIG. 6A. However the graph shown in FIG. 7A uses stepped or ramped control gate voltage, a stepped or ramped P-well voltage or a combination of a stepped or ramped control gate voltage and a stepped or ramped P-well voltage.

Figure 7B:
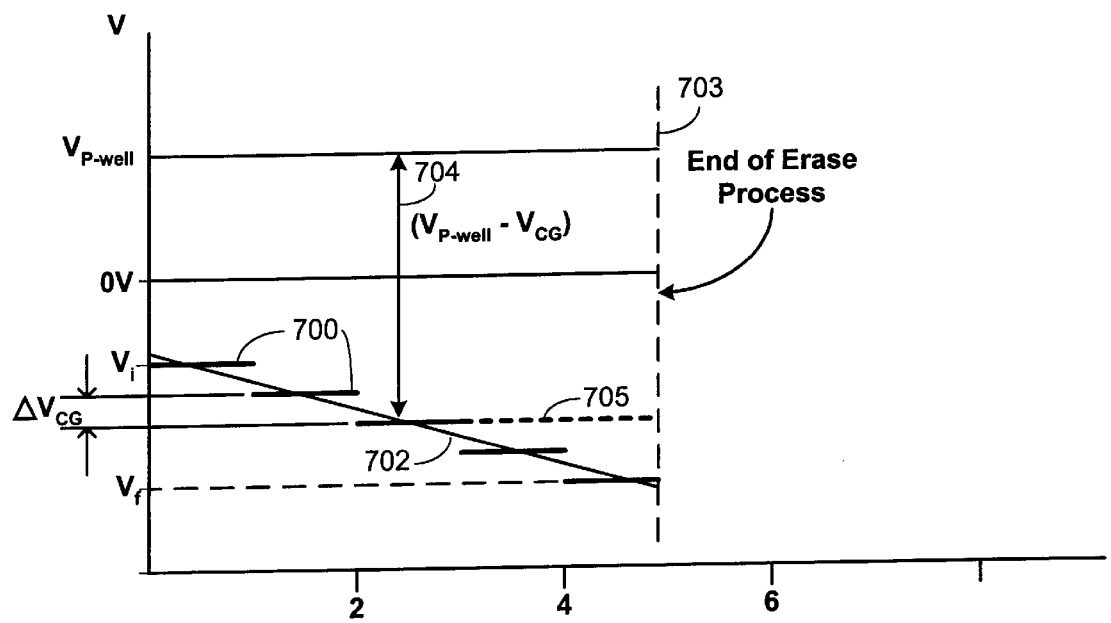
FIG. 7B is a graph of the stepped or ramped control gate voltage versus time corresponding to FIG. 7A.

FIG. 7B shows a method of erasing semiconductor memory devices using a stepped control gate voltage 700 or a ramped control gate voltage 702 during the erase procedure. The end of the erase procedure is indicated by dashed line 703. The voltage difference between the P-well and the control gate is shown at 704. The control gate voltage is stepped or ramped until a selected number of memory cells verify as erased at which time the control gate voltage is clamped, as indicated by dashed line 705. In this embodiment and the embodiments that follow, the ramped voltage can have a constant slope or the slope can vary.

Figure 7C:
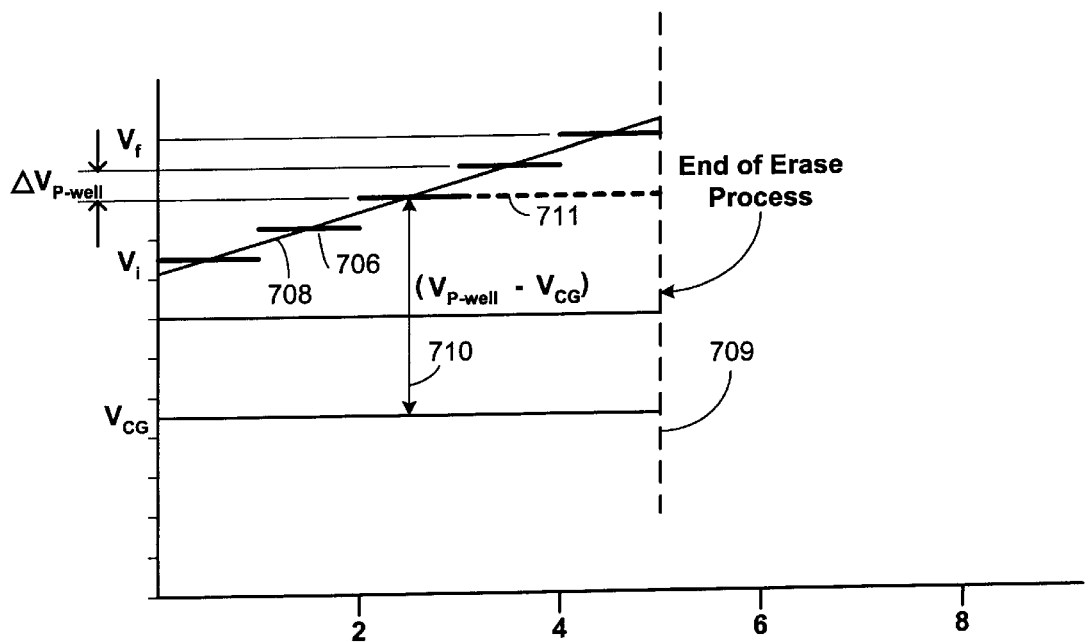
FIG. 7C is a graph of the stepped or ramped P-well voltage versus time corresponding to FIG. 7A.

FIG. 7C shows a method of erasing semiconductor memory devices using a stepped P-well voltage 706 or a ramped P-well voltage 708 during the erase procedure. The end of the erase procedure is indicated by dashed line 709. The voltage difference between the P-well and the control gate is shown at 710. The P-well voltage is stepped or ramped until a selected number of memory cells verify as erased at which time the P-well voltage is clamped, as indicated by dashed line 711.

Figure 7D:
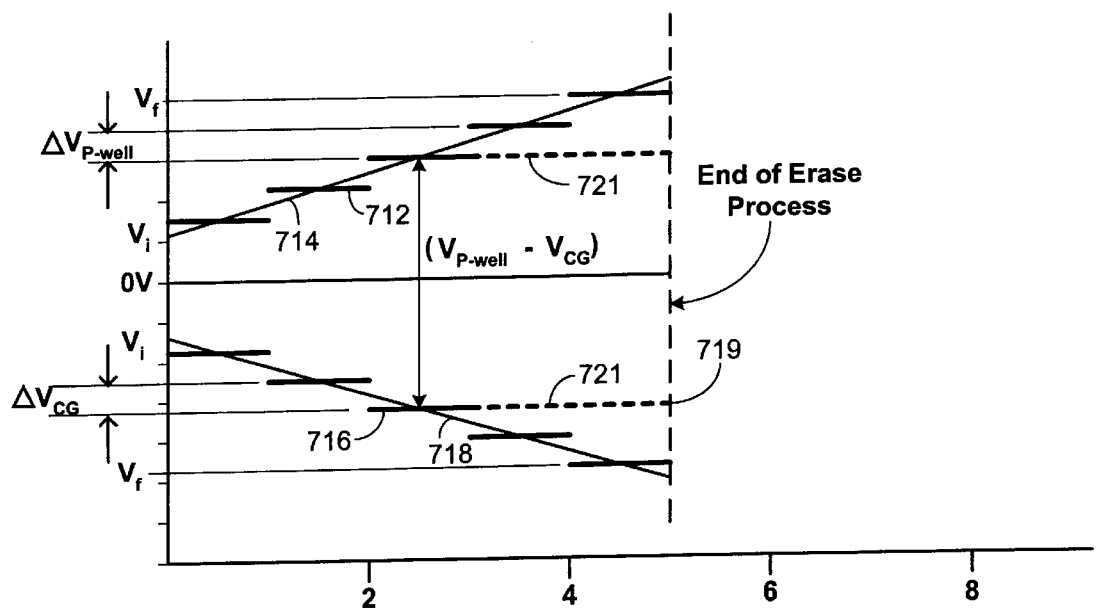
FIG. 7D is a graph of the stepped or ramped P-well voltage and of the stepped or ramped control gate voltage versus time corresponding to FIG. 7A.

FIG. 7D shows a method of erasing semiconductor memory devices using a stepped P-well voltage 712 or a ramped P-well voltage 714 as well as a stepped control gate voltage 716 or a ramped control gate voltage 718. The end of the erase procedure is indicated by dashed line 719. The voltage difference between the P-well voltage and the control gate is shown at 720. The P-well voltage and the control gate voltage is stepped or ramped until a selected number of memory cells verify as erased at which time the P-well voltage and the control gate voltage is clamped as indicated by dashed lines 721.

The stepped voltages shown in the figures indicate that the stepped voltage increments equally, however, the stepped voltages can increment an equal amount, at an increasing amount or at a decreasing amount. The erase times for the flash memory devices using stepped or ramped voltages as shown in FIGS. 7B, 7C & 7D are essentially the same as the erase time for the flash memory devices using a constant control gate devices as shown in FIG. 6A. The initial control gate voltages $V_i$ shown in FIGS. 7B, 7C & 7D are lower than the voltage used for the constant control gate voltage as shown in FIG. 6A for the constant control gate method. There are several methods to determine the final voltage $V_f$ at which the stepping or Tamping is clamped. A simple control gate voltage stepping scheme can be used, that is, a control gate voltage stepping scheme without any intelligent verify and maximum gate voltage clamping scheme. However, a self-adjusting scheme to clamp the maximum gate voltage at the end of erase can be used to limit the maximum end-of-erase field. One such scheme is to use an erase algorithm that incorporates either a diagonal verify or verify of a few selected columns or a selected number of bits during the initial portion of the erase. During the initial phase, the gate voltage keeps incrementing at a predetermined rate. Once the initial phase of erase is completed with the diagonal verify or selected columns verify, the gate voltage is clamped and the sector proceeds with the regular erase/erase verify for all the bits in the sector. This method has the advantage of automatically adjusting the end of erase field depending on the erase speed of the sector.

Figure 8A:
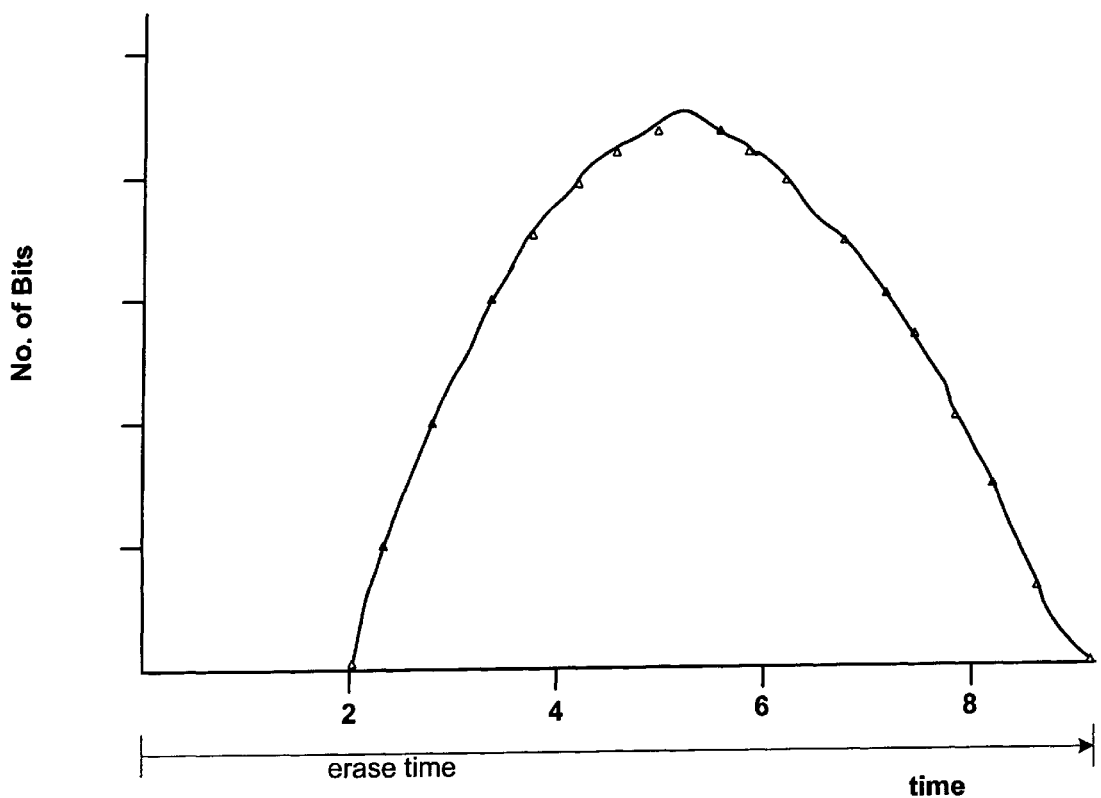
FIG. 8A is a graph of the number of bits erased versus time for flash memory devices simulating an array after 50,000 programming/erase cycles using a stepped control gate voltage during erase, a stepped P-well voltage during erase, or a stepped control gate voltage and a stepped P-well voltage during erase.

FIG. 8A is a graph of the number of bits erased versus time for flash memory devices simulating an array after 50,000 programming/erase cycles using a stepped control gate voltage. The initial voltage $V_i$ is determined by noting that after 50,000 programming/erase cycles there is a voltage reduction in the effective gate voltage along with an erase speed degradation of about 7 times when using constant control gate voltage during erase. FIG. 8A shows that when the initial voltage $V_i$ is reduced by the amount of the voltage reduction to simulate the 50,000 programming/erase cycling effect and the voltage incremented by an amount in the range of approximately 0.1 to 0.4V in a time period in the range of approximately every 5–20 milliseconds, the erase speed obtained is about 10×, which is only about a 2 times speed degradation (when compared to the graph shown in FIG. 7A.

Figure 8B:
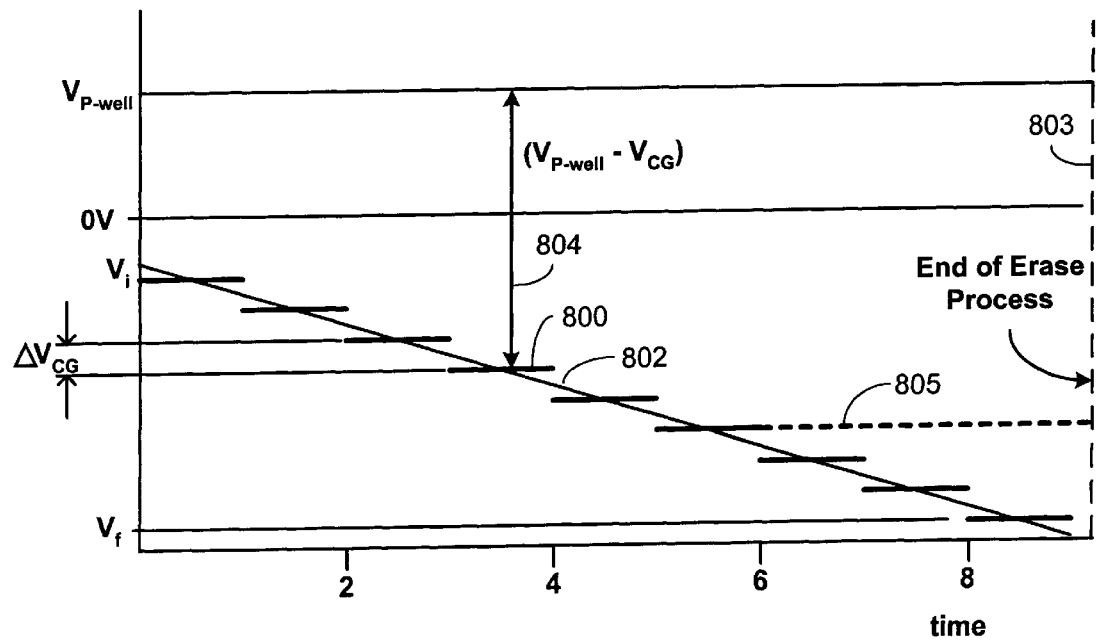
FIG. 8B is a graph of the stepped or ramped control gate voltage versus time corresponding to FIG. 8A.

FIG. 8B shows a method of erasing semiconductor memory devices using a stepped control gate voltage 800 or a ramped control gate voltage 802 during the erase procedure. The end of the erase procedure is indicated by dashed line 803. The voltage difference between the P-well and the control gate is shown at 804. The control gate voltage is stepped or ramped until a selected number of memory cells verify as erased at which time the control gate voltage is clamped, as indicated at 805.

Figure 8C:
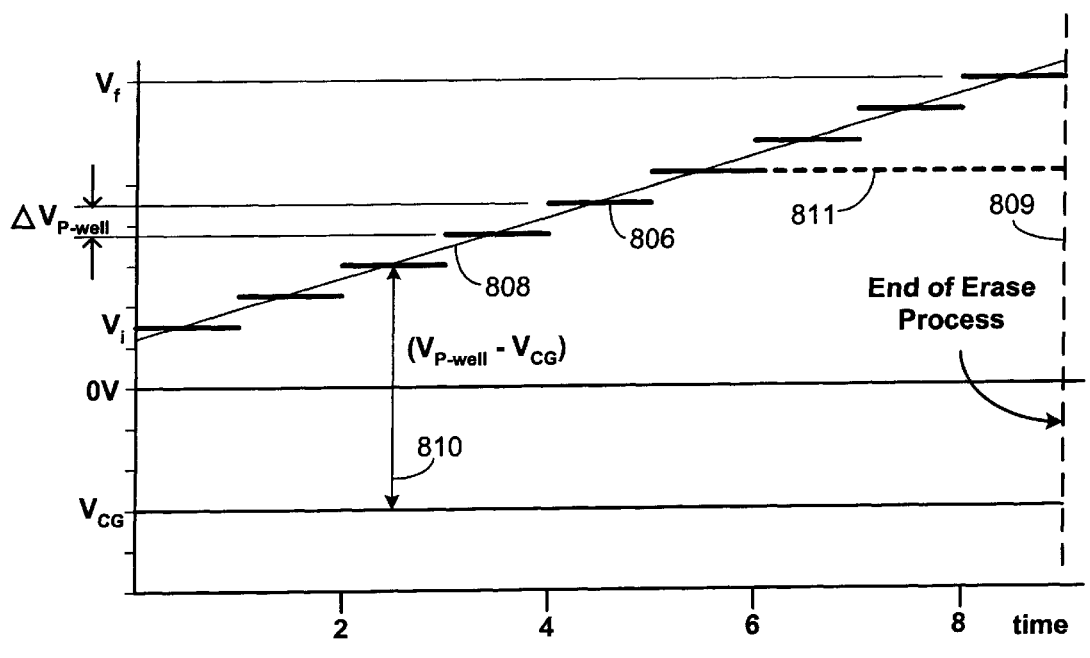
FIG. 8C is a graph of the stepped or ramped P-well voltage versus time corresponding to FIG. 8A.

FIG. 8C shows a method of erasing semiconductor memory devices using a stepped P-well voltage 806 or a ramped P-well voltage 808 during the erase procedure. The end of the erase procedure is indicated by dashed line 809. The voltage difference between the P-well and the control gate is shown at 810. The P-well voltage is stepped or ramped until a selected number of memory cells verify as erased at which time the P-well voltage is clamped, as indicated by dashed line 811.

Figure 8D:
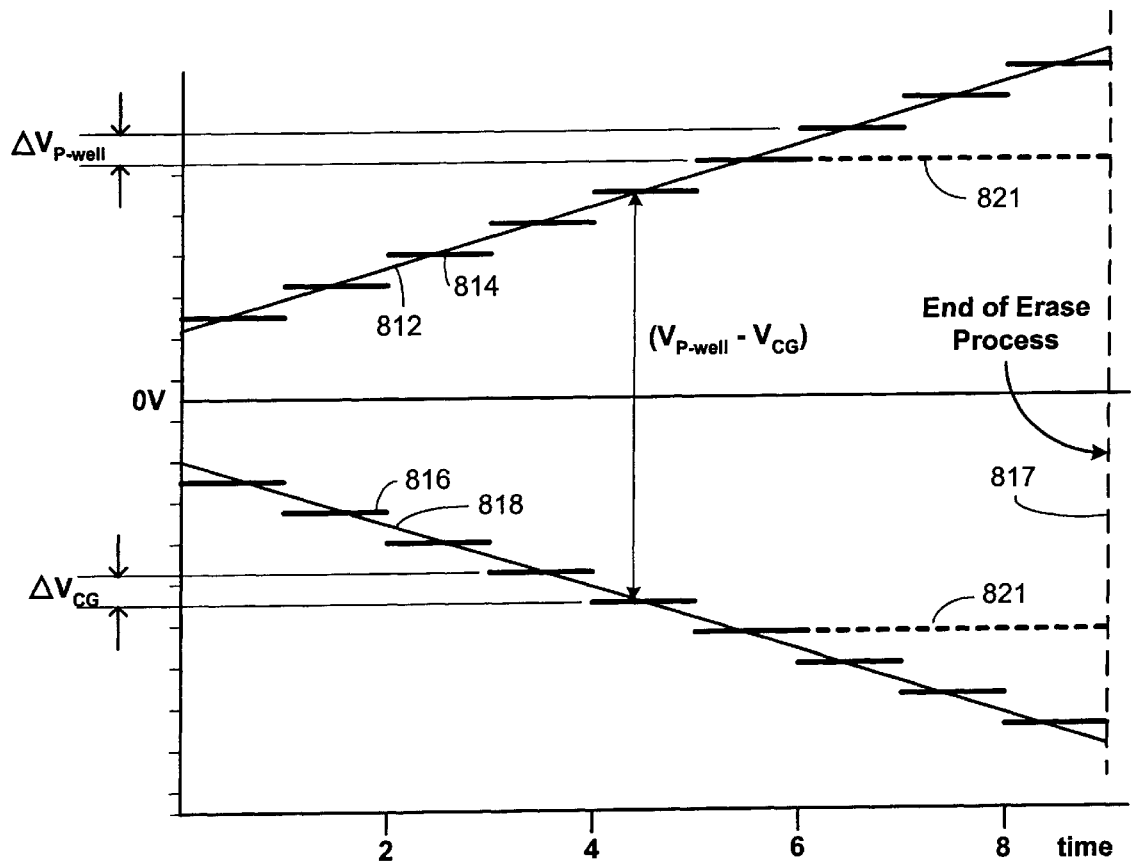
FIG. 8D is a graph of the stepped or ramped P-well voltage and of the stepped or ramped control gate versus time corresponding to FIG. 8A.

FIG. 8D shows a method of erasing semiconductor memory devices using a stepped P-well voltage 812 or a ramped P-well voltage 814 as well as a stepped control gate voltage 816 or a ramped control gate voltage 818. The end of the erase procedure is indicated by dashed line 817. The voltage difference between the P-well voltage and the control gate is shown at 820. The P-well voltage and the control gate voltage is stepped or ramped until a selected number of memory cells verify as erased at which time the P-well voltage and the control gate voltage is clamped as indicated by dashed lines 821. The method of clamping the stepping or ramped voltages is discussed above in conjunction with FIGS. 7B–7D.

Figure 9A:
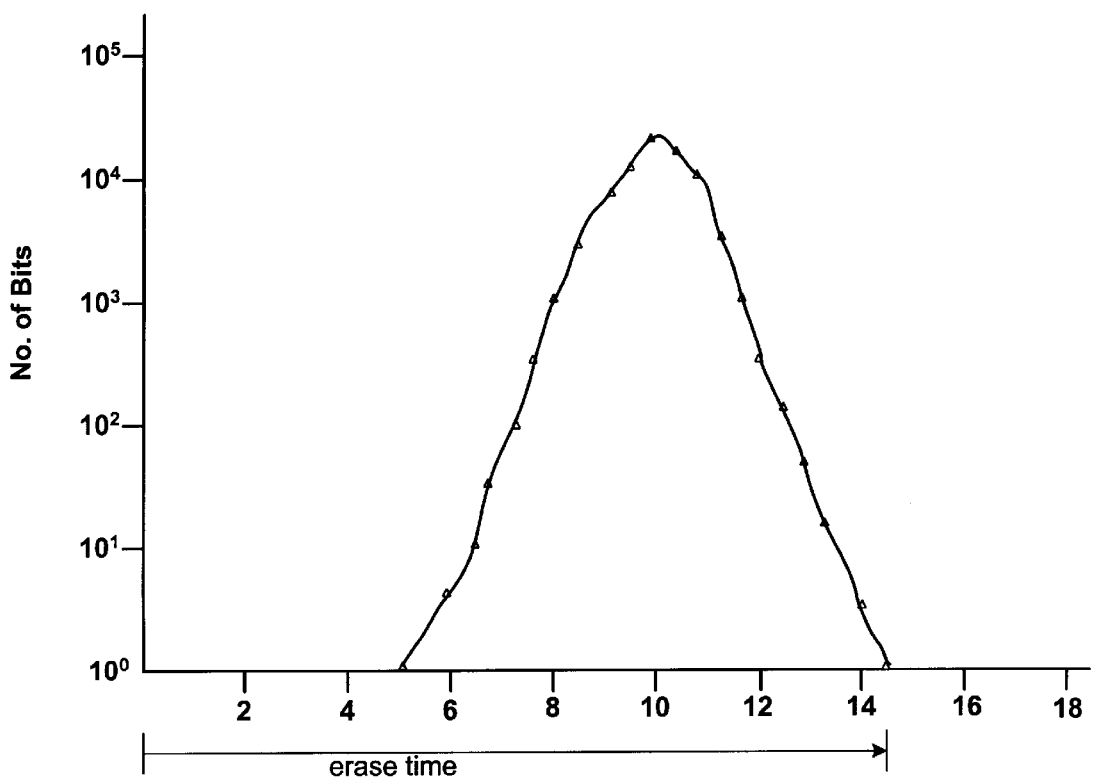
FIG. 9A is a graph of the number of bits erased versus time for a flash memory devices simulating an array after 100,000 programming/erase cycles using a stepped control gate voltage during erase, a stepped P-well voltage during erase, or a stepped control gate voltage and a stepped P-well voltage during erase.

FIG. 9A is a graph of the number of bits erased versus time for flash memory devices simulating an array after 100,000 programming/erase cycle using a stepped control gate voltage. The initial voltage $V_i$ is the voltage that simulates 100,000 programming/erase cycles and is determined as described above in conjunction with FIG. 8A. FIG. 9A shows that when the initial voltage $V_i$ is reduced to simulate the 100,000 programming/erase cycling effect and the voltage incremented by an amount in the range of approximately 0.1 to 0.4V in a time period in the range of approximately 5–20 milliseconds, the erase speed obtained is about 15×, which is only about a 2 times speed degradation (when compared to the graph shown in FIG. 7A.

Figure 9B:
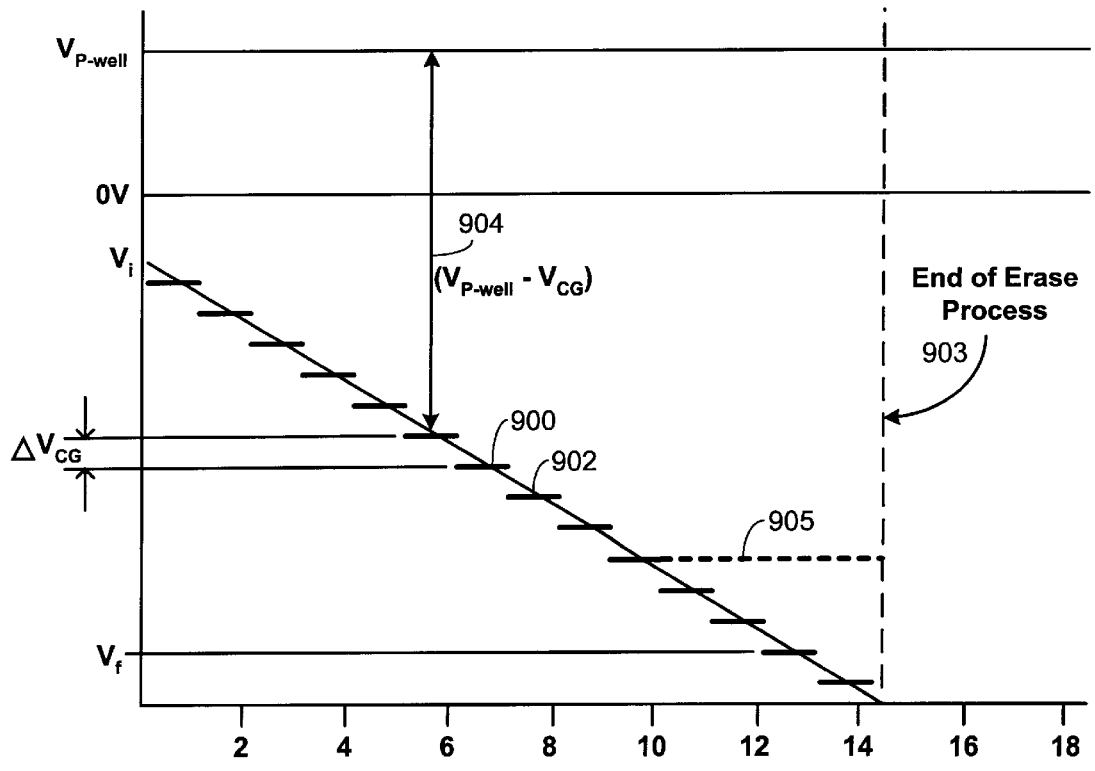
FIG. 9B is a graph of the stepped or ramped control gate voltage versus time corresponding to FIG. 9A.

FIG. 9B shows a method of erasing semiconductor memory devices using a stepped control gate voltage 900 or a ramped control gate voltage 902 during the erase procedure. The end of the erase procedure is indicated by dashed line 903. The voltage difference between the P-well and the control gate is shown at 904. The control gate voltage is stepped or ramped until a selected number of memory cells verify as erased at which time the control gate voltage is clamped, as indicated by dashed line 905.

Figure 9C:
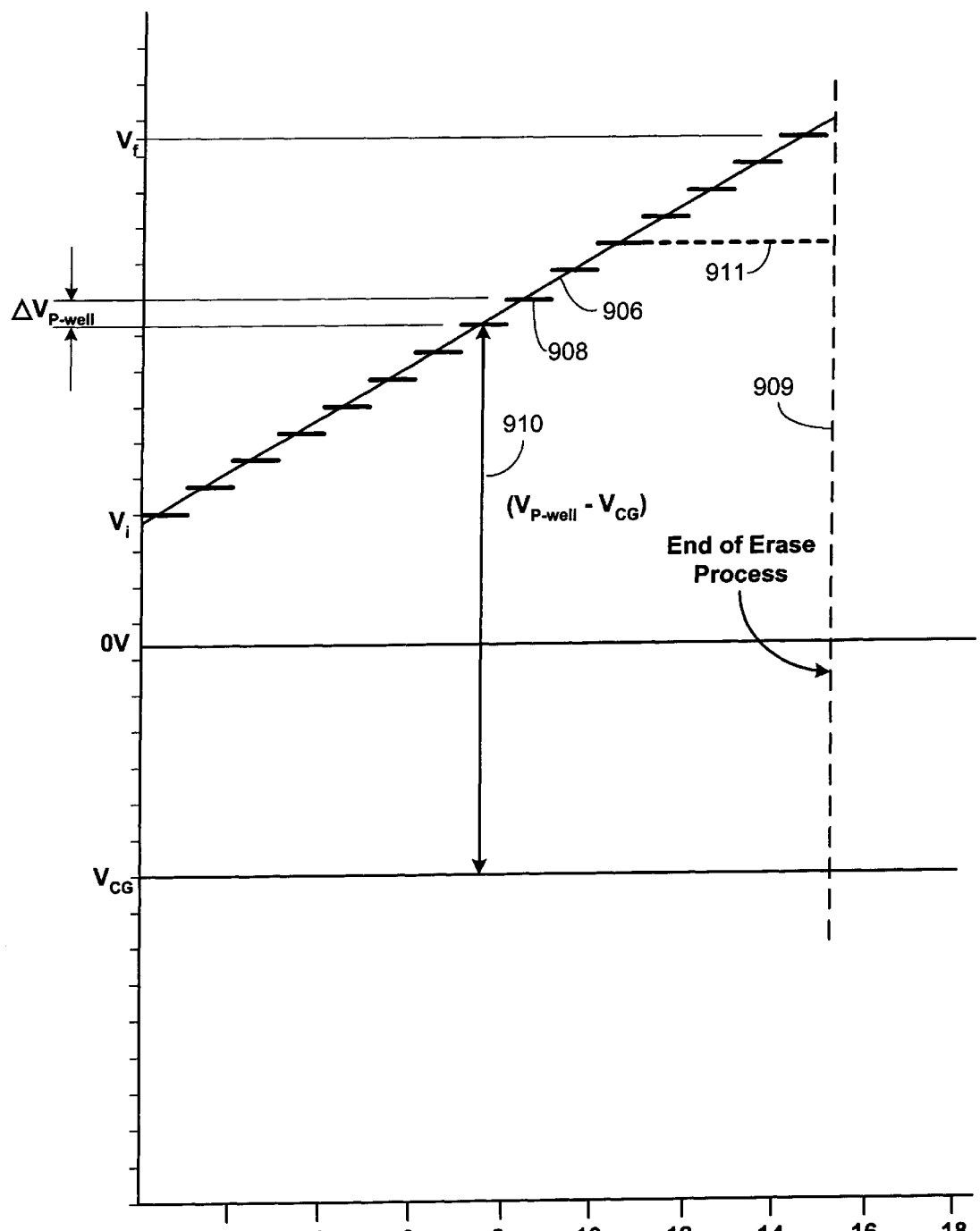
FIG. 9C is a graph of the stepped or ramped P-well voltage versus time corresponding to FIG. 9A.

FIG. 9C shows a method of erasing semiconductor memory devices using a stepped P-well voltage 906 or a ramped P-well voltage 908 during the erase procedure. The end of the erase procedure is indicated by dashed line 909. The voltage difference between the P-well and the control gate is shown at 910. The P-well voltage is stepped or ramped until a selected number of memory cells verify as erased at which time the P-well voltage is clamped, as indicated by dashed line 911.

Figure 9D:
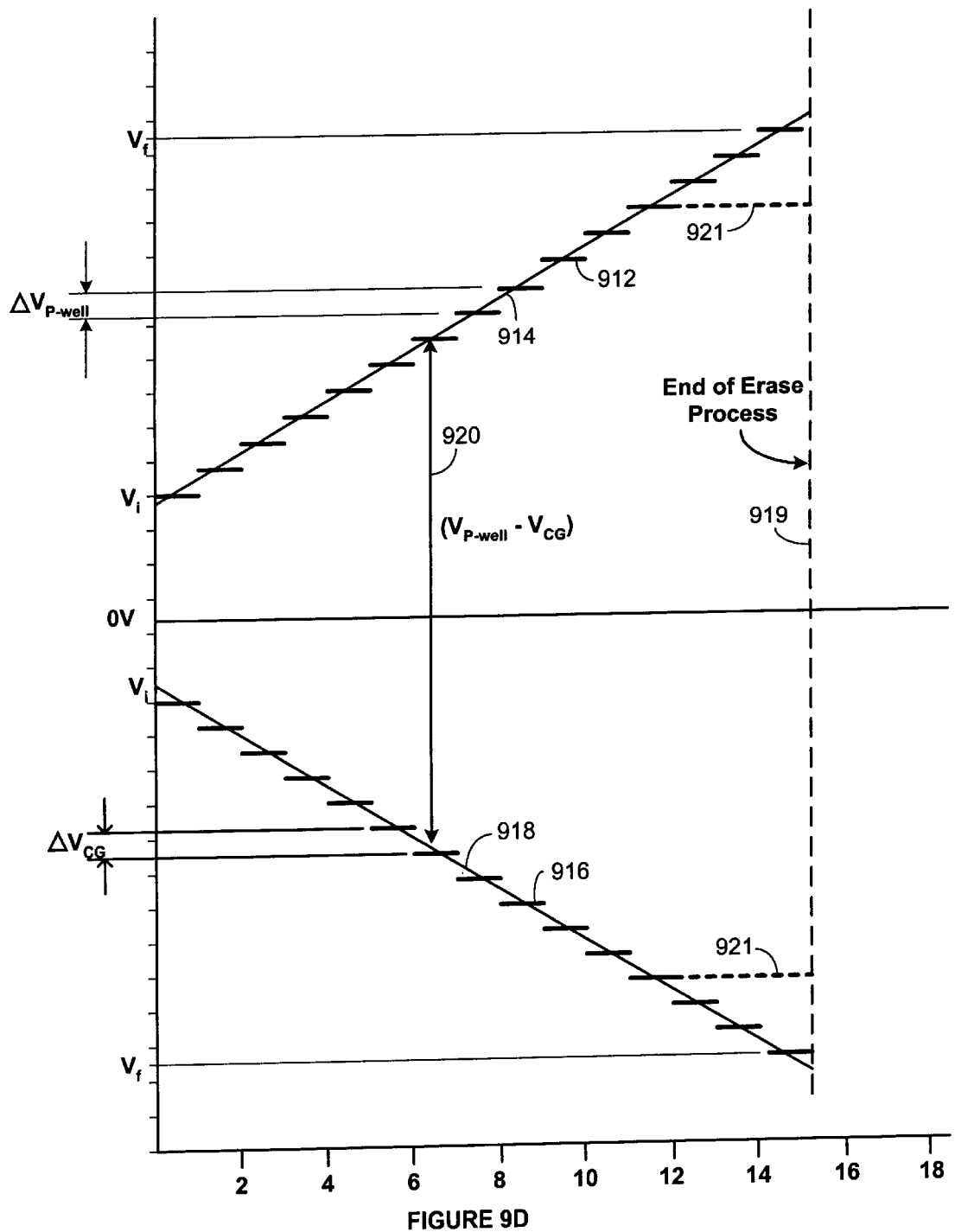
FIG. 9D is a graph of the stepped or ramped P-well voltage and of the stepped or ramped control gate versus time corresponding to FIG. 9A.

FIG. 9D shows a method of erasing semiconductor memory devices using a stepped P-well voltage 912 or a ramped P-well voltage 914 as well as a stepped control gate voltage 916 or a ramped control gate voltage 918. The end of the erase procedure is indicated by dashed line 919. The voltage difference between the P-well voltage and the control gate is shown at 920. The P-well voltage and the control gate voltage is stepped or ramped until a selected number of memory cells verify as erased at which time the P-well voltage and the control gate voltage is clamped as indicated by dashed lines 921. The method of clamping the stepping or ramped voltage is discussed above in conjunction with FIG. 7B.

Figure 10:
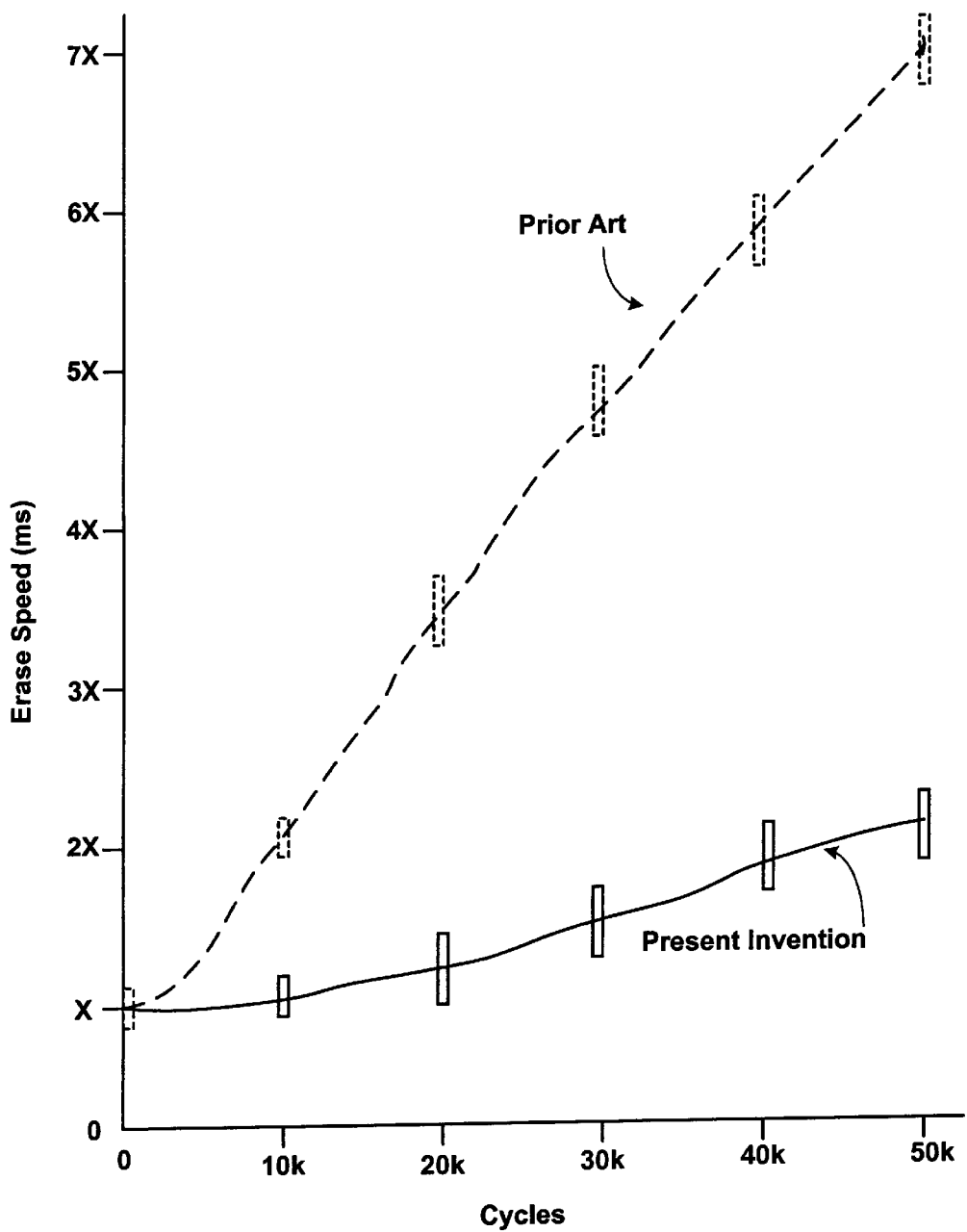
FIG. 10 compares the graph of the erase speed versus number of programming/erase cycles for flash memory devices using a constant control gate voltage during erase and the graph of the erase speed versus number of programming/erase cycles for flash memory devices using a stepped control gate voltage during erase.

FIG. 10 compares the graph of the erase speed versus number of programming/erase cycles for flash memory devices using a constant control gate voltage during erase and the graph of the erase peed versus number of programming/erase cycles for flash memory devices using a stepped control gate voltage during erase obtained from measurements. The comparison shows that the erase speed degradation is decreased from approximately 6–7 times degradation to approximately 2 times degradation.

Thus, using the stepped gate voltage during erase results in only a linear degradation in erase speed compared to a much faster degradation observed with constant gate voltage channel erase. The other advantage of stepped gate voltage is that the initial field across the tunnel oxide can be limited during erase by choosing an appropriate value of initial gate voltage, which provides improved tunnel oxide reliability.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for erasing a flash Electrically-Erasable Programmable Read Only Memory (EEPROM) that includes a plurality of field effect transistor memory cells each having a source, a drain, a floating gate, a well and a control gate, the method comprising the steps of:
   (a) applying a voltage differential V between the control gate and the well;
   (b) incrementing the voltage differential V by ΔV resulting in a new voltage differential;
   (c) repeating step (b) until a selected number of the plurality of memory cells verify as erased; and
   (d) clamping the new voltage differential when the plurality of memory cells verify as erased.

2. The method of claim 1, wherein the plurality of memory cells verify as erased when a selected column verifies as erased.

3. The method of claim 1, wherein applying a voltage differential between the control gate and the well is accomplished by:
   (e) applying a positive voltage ($V_{p\text{-}well}$) to the well; and
   (f) applying a negative voltage ($-V_{CG}$) to the control gate, wherein the algebraic sum of $V_{p\text{-}well}$ and $-V_{CG}$ is the voltage differential V.

4. The method of claim 3, wherein step (b) is accomplished by applying a ramped voltage to the control gate.

5. The method of claim 4, wherein the ramped voltage is an increasing negative voltage.

6. The method of claim 3, wherein step (b) is accomplished by applying a stepped voltage to the control gate.

7. The method of claim 6, wherein the stepped voltage is stepped to be more negative.

8. The method of claim 3, wherein step (b) is accomplished by applying a ramped voltage to the well.

9. The method of claim 8, wherein the ramped voltage applied to the well is an increasing positive voltage.

10. The method of claim 3, where step (b) is accomplished by applying a stepped voltage to the well.

11. The method of claim 10, wherein the stepped voltage is stepped to be more positive.

12. The method of claim 1, wherein step (b) is accomplished by:
   (g) applying a ramped voltage to the well; and
   (h) applying a ramped voltage to the control gate.

13. The method of claim 12, wherein the ramped voltage applied to the well is an increasing positive voltage.

14. The method of claim 13, wherein the ramped voltage applied to the control gate is an increasing negative voltage.

15. The method of claim 1, wherein step (b) is accomplished by:
   (i) applying a stepped voltage to the well; and
   (j) applying a stepped voltage to the control gate.

16. The method of claim 1, in which:
   the cells are arranged in a plurality of sectors; and
   the method comprises performing steps (a), (b) and (c) on the sectors sequentially.

17. The method of claim 1, in which step (b) further comprises floating the source and drain.

18. The method of claim 1, in which step (b) further comprises electrically connecting the source and drain to the well.

19. The method of claim 1, in which:
   step (a) comprises performing a complete erase and Automatic Program Disturb (APD) procedure to the plurality of memory cells; and
   step (b) is performed after completion of step (a).

* * * * *

UNITED STATES PATENT AND TRADEMARK OFFICE
CERTIFICATE OF CORRECTION

PATENT NO.    : 6,188,609 B1                                              Page 1 of 1
DATED         : February 13, 2001
INVENTOR(S)   : Ravi S. Sunkavalli et al.

It is certified that error appears in the above-identified patent and that said Letters Patent is hereby corrected as shown below:

Column 14,
Line 1, insert -- the selected number of -- after "when"

Signed and Sealed this

Twenty-fifth Day of November, 2003

JAMES E. ROGAN
*Director of the United States Patent and Trademark Office*